United States Patent
Bhattacharyya et al.

(10) Patent No.: US 9,830,421 B2
(45) Date of Patent: Nov. 28, 2017

(54) ALIGNMENT OF INSPECTION TO DESIGN USING BUILT IN TARGETS

(71) Applicant: KLA-Tencor Corporation, Milpitas, CA (US)

(72) Inventors: Santosh Bhattacharyya, San Jose, CA (US); Bjorn Braeuer, Beaverton, OR (US); Lisheng Gao, Morgan Hill, CA (US)

(73) Assignee: KLA-Tencor Corp., Milpitas, CA (US)

( * ) Notice: Subject to any disclaimer, the term of this patent is extended or adjusted under 35 U.S.C. 154(b) by 0 days.

(21) Appl. No.: 14/983,452

(22) Filed: Dec. 29, 2015

(65) Prior Publication Data
US 2016/0188784 A1 Jun. 30, 2016

Related U.S. Application Data

(60) Provisional application No. 62/098,732, filed on Dec. 31, 2014.

(51) Int. Cl.
*G06F 17/50* (2006.01)
*G03F 7/20* (2006.01)

(52) U.S. Cl.
CPC ...... *G06F 17/5081* (2013.01); *G03F 7/70616* (2013.01)

(58) Field of Classification Search
CPC ............. G01N 21/9501; G01N 21/956; G01N 2223/6116; G01N 21/8851; G01N 23/2251; H01L 2223/54426; G03F 1/84; G03F 7/7065; G03F 7/70141; G03F 7/70433; G03F 7/70616; G03F 7/70633
See application file for complete search history.

(56) References Cited

U.S. PATENT DOCUMENTS

| | | | |
|---|---|---|---|
| 7,570,796 B2 | 8/2009 | Zafar et al. | |
| 7,676,077 B2 | 3/2010 | Kulkarni et al. | |
| 7,968,354 B1* | 6/2011 | Haller | G01N 21/9501 |
| | | | 257/E21.521 |

(Continued)

FOREIGN PATENT DOCUMENTS

JP    2012-225768    11/2012

OTHER PUBLICATIONS

International Search Report for PCT/US2015/068057 dated Apr. 22, 2016.
Written Opinion for PCT/US2015/068057 dated Apr. 22, 2016.

*Primary Examiner* — Nghia Doan
(74) *Attorney, Agent, or Firm* — Ann Marie Mewherter

(57) ABSTRACT

Methods and systems for determining a position of output generated by an inspection subsystem in design data space are provided. One method includes selecting one or more alignment targets from a design for a specimen. At least a portion of the one or more alignment targets include built in targets included in the design for a purpose other than alignment of inspection results to design data space. At least the portion of the one or more alignment targets does not include one or more individual device features. One or more images for the alignment target(s) and output generated by the inspection subsystem at the position(s) of the alignment target(s) may then be used to determine design data space positions of other output generated by the inspection subsystem in a variety of ways described herein.

26 Claims, 6 Drawing Sheets

(56) References Cited

U.S. PATENT DOCUMENTS

| | | | |
|---|---|---|---|
| 8,664,594 B1 | 3/2014 | Jiang et al. | |
| 8,692,204 B2 | 4/2014 | Kojima et al. | |
| 8,698,093 B1 | 4/2014 | Gubbens et al. | |
| 8,716,662 B1 | 5/2014 | MacDonald et al. | |
| 9,401,015 B2 | 7/2016 | Minekawa et al. | |
| 2007/0230770 A1* | 10/2007 | Kulkarni | G06F 17/5045 |
| | | | 382/149 |
| 2012/0155740 A1 | 6/2012 | Cho et al. | |
| 2013/0298088 A1 | 11/2013 | Lee et al. | |
| 2014/0072204 A1 | 3/2014 | Minekawa et al. | |
| 2014/0195992 A1 | 7/2014 | Ramachandran | |
| 2016/0188784 A1* | 6/2016 | Bhattacharyya | G03F 7/70616 |
| | | | 716/111 |

* cited by examiner

ALIGNMENT OF INSPECTION TO DESIGN USING BUILT IN TARGETS

BACKGROUND OF THE INVENTION

1. Field of the Invention

This invention generally relates to methods and systems for determining a position of output generated by an inspection subsystem in design data space.

2. Description of the Related Art

The following description and examples are not admitted to be prior art by virtue of their inclusion in this section.

An integrated circuit (IC) design may be developed using a method or system such as electronic design automation (EDA), computer aided design (CAD), and other IC design software. Such methods and systems may be used to generate the circuit pattern database from the IC design. The circuit pattern database includes data representing a plurality of layouts for various layers of the IC. Data in the circuit pattern database may be used to determine layouts for a plurality of reticles. A layout of a reticle generally includes a plurality of polygons that define features in a pattern on the reticle. Each reticle is used to fabricate one of the various layers of the IC. The layers of the IC may include, for example, a junction pattern in a semiconductor substrate, a gate dielectric pattern, a gate electrode pattern, a contact pattern in an interlevel dielectric, and an interconnect pattern on a metallization layer.

The term "design data" as used herein generally refers to the physical design (layout) of an IC and data derived from the physical design through complex simulation or simple geometric and Boolean operations.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect defects on wafers to promote higher yield in the manufacturing process and thus higher profits. Inspection has always been an important part of fabricating semiconductor devices such as ICs. However, as the dimensions of semiconductor devices decrease, inspection becomes even more important to the successful manufacture of acceptable semiconductor devices because smaller defects can cause the devices to fail.

As design rules shrink, however, semiconductor manufacturing processes may be operating closer to the limitations on the performance capability of the processes. In addition, smaller defects can have an impact on the electrical parameters of the device as the design rules shrink, which drives more sensitive inspections. Therefore, as design rules shrink, the population of potentially yield relevant defects detected by inspection grows dramatically, and the population of nuisance defects detected by inspection also increases dramatically. Therefore, more and more defects may be detected on the wafers, and correcting the processes to eliminate all of the defects may be difficult and expensive.

Recently, inspection systems and methods are increasingly being designed to focus on the relationship between defect and design since it is the impact on the design for a wafer that will determine whether and how much a defect matters. For example, some methods have been developed for aligning inspection and design coordinates. One such method depends on the accuracy of the inspection system coordinate registration to design. Another such method involves conducting post-processing alignment on the inspection image patch and associated design clip.

There are, however, a number of disadvantages to many of the existing inspection systems and methods. For example, when the methods depend on the accuracy of the inspection system coordinate registration to design, the methods do not necessarily provide the alignment accuracy that is needed. In addition, post-processing alignment of the inspection image patch and associated design clip is dependent on having sufficient information in the inspection patch and design clip. Often, it is the case that this criteria is not met, and the defects concerned cannot be used in the rest of the analysis or worse yet bad data is propagated through the remainder of the analysis thereby reducing the accuracy of the outcome.

Accordingly, it would be advantageous to develop systems and/or methods for determining a position of output generated by an inspection subsystem in design data space that do not have one or more of the disadvantages described above.

SUMMARY OF THE INVENTION

The following description of various embodiments is not to be construed in any way as limiting the subject matter of the appended claims.

One embodiment relates to a system configured to determine a position of output generated by an inspection subsystem in design data space. The system includes an inspection subsystem that includes at least an energy source and a detector. The energy source is configured to generate energy that is directed to a specimen. The detector is configured to detect energy from the specimen and to generate output responsive to the detected energy. The system also includes one or more computer subsystems configured for selecting one or more alignment targets from a design for the specimen. At least a portion of the one or more alignment targets includes built in targets included in the design for a purpose other than alignment of inspection results to design data space. At least the portion of the one or more alignment targets does not include one or more individual defect features. The computer subsystem(s) are also configured for aligning one or more images for the one or more alignment targets to one or more portions of the design corresponding to the one or more alignment targets. In addition, the computer subsystem(s) are configured for determining one or more offsets between the one or more images and the one or more portions of the design based on results of aligning the one or more images. The computer subsystem(s) are further configured for aligning output generated by the inspection subsystem at one or more positions of the one or more alignment targets on the specimen to the one or more images for the one or more alignment targets. Furthermore, the computer subsystem(s) are configured for determining one or more additional offsets between the output generated at the one or more positions of the one or more alignment targets on the specimen and the one or more images for the one or more alignment targets based on results of aligning the output. The computer subsystem(s) are also configured for determining design data space positions of output generated by the inspection subsystem at other positions on the specimen based on the one or more offsets, the one or more additional offsets, and specimen space positions of the output generated at the other positions on the specimen. The system may be further configured as described herein.

Another embodiment relates to a computer-implemented method for determining a position of output generated by an inspection subsystem in design data space. The method includes steps for each of the functions of the one or more computer subsystems described above. The steps of the method are performed by one or more computer systems. The method may be performed as described further herein. In addition, the method may include any other step(s) of any other method(s) described herein. Furthermore, the method may be performed by any of the systems described herein.

An additional embodiment relates to a non-transitory computer-readable medium storing program instructions executable on a computer system for performing a computer-implemented method for determining a position of output generated by an inspection subsystem in design data space. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Other objects and advantages of the invention will become apparent upon reading the following detailed description and upon reference to the accompanying drawings in which.

Figure 1:
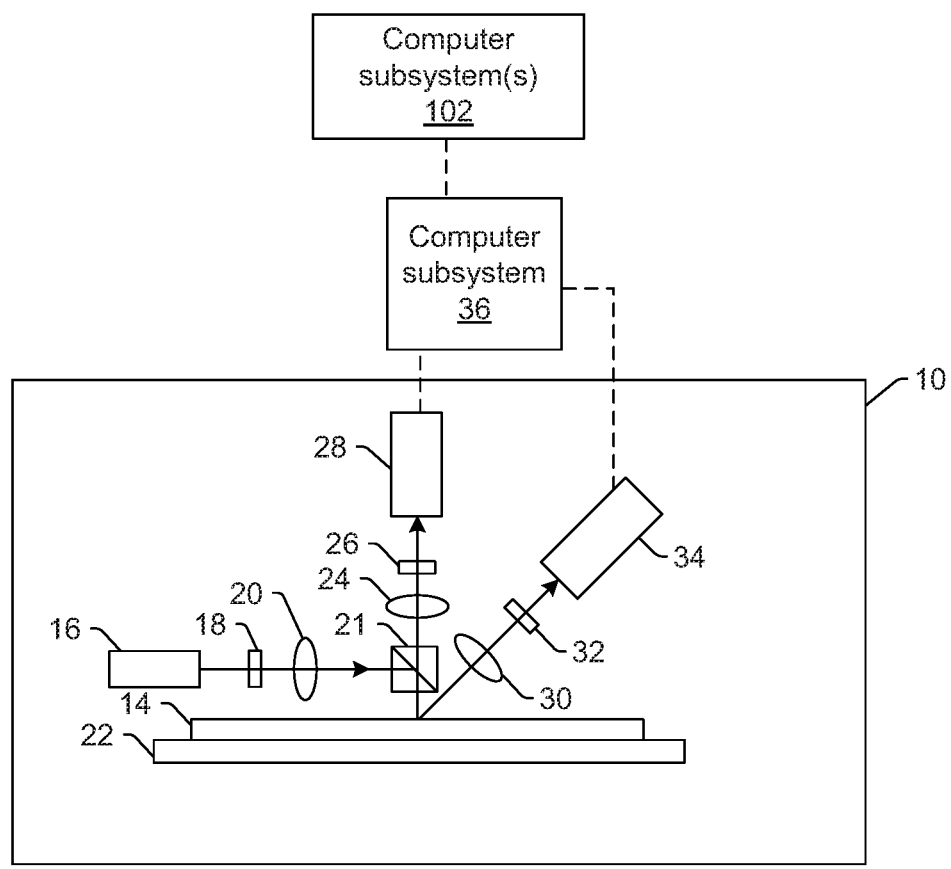
FIGS. 1 and 2 are schematic diagrams illustrating side views of embodiments of a system configured as described herein.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The terms "design" and "design data" as used herein generally refer to the physical design (layout) of an IC and data derived from the physical design through complex simulation or simple geometric and Boolean operations. In addition, an image of a reticle acquired by a reticle inspection system and/or derivatives thereof can be used as a "proxy" or "proxies" for the design. Such a reticle image or a derivative thereof can serve as a substitute for the design layout in any embodiments described herein that use a design. The design may include any other design data or design data proxies described in commonly owned U.S. Pat. No. 7,570,796 issued on Aug. 4, 2009 to Zafar et al. and U.S. Pat. No. 7,676,077 issued on Mar. 9, 2010 to Kulkarni et al., both of which are incorporated by reference as if fully set forth herein. In addition, the design data can be standard cell library data, integrated layout data, design data for one or more layers, derivatives of the design data, and full or partial chip design data.

In general, however, the design information or data cannot be generated by imaging a wafer with a wafer inspection system. For example, the design patterns formed on the wafer may not accurately represent the design for the wafer and the wafer inspection system may not be capable of generating images of the design patterns formed on the wafer with sufficient resolution such that the images could be used to determine information about the design for the wafer. Therefore, in general, the design information or design data cannot be generated using a physical wafer. In addition, the "design" and "design data" described herein refers to information and data that is generated by semiconductor device designer in a design process and is therefore available for use in the embodiments described herein well in advance of printing of the design on any physical wafers.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

One embodiment relates to a system configured to determine a position of output generated by an inspection subsystem in design data space. The embodiments may be configured for pattern to design alignment (PDA) with built in targets for specimen inspection. PDA accuracy is critical for certain types of specimen inspection such as those in which design information is used during inspection to perform one or more functions such as those described further herein.

In one embodiment, the specimen includes a wafer. In another embodiment, the specimen includes a reticle. The wafer and the reticle may include any wafer and reticle known in the art.

One embodiment of such a system is shown in FIG. 1. The system includes an inspection subsystem that includes at least an energy source and a detector. The energy source is configured to generate energy that is directed to a specimen. The detector is configured to detect energy from the specimen and to generate output responsive to the detected energy.

In one embodiment, the energy directed to the specimen includes light, and the energy detected from the specimen includes light. For example, in the embodiment of the system shown in FIG. 1, inspection subsystem 10 includes an illumination subsystem configured to direct light to specimen 14. The illumination subsystem includes at least one light source. For example, as shown in FIG. 1, the illumination subsystem includes light source 16. In one embodiment, the illumination subsystem is configured to direct the light to the specimen at one or more angles of incidence, which may include one or more oblique angles and/or one or more normal angles. For example, as shown in FIG. 1, light from light source 16 is directed through optical element 18 and then lens 20 to beam splitter 21, which directs the light to specimen 14 at a normal angle of incidence. The angle of incidence may include any suitable angle of incidence, which may vary depending on, for instance, characteristics of the specimen and the defects to be detected on the specimen.

The illumination subsystem may be configured to direct the light to the specimen at different angles of incidence at different times. For example, the inspection subsystem may be configured to alter one or more characteristics of one or more elements of the illumination subsystem such that the light can be directed to the specimen at an angle of incidence that is different than that shown in FIG. 1. In one such example, the inspection subsystem may be configured to move light source 16, optical element 18, and lens 20 such that the light is directed to the specimen at a different angle of incidence.

In some instances, the inspection subsystem may be configured to direct light to the specimen at more than one angle of incidence at the same time. For example, the illumination subsystem may include more than one illumination channel, one of the illumination channels may include light source 16, optical element 18, and lens 20 as shown in FIG. 1 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen at different angles of incidence may be different such that light resulting from illumination of the specimen at the different angles of incidence can be discriminated from each other at the detector(s).

In another instance, the illumination subsystem may include only one light source (e.g., source 16 shown in FIG. 1) and light from the light source may be separated into different optical paths (e.g., based on wavelength, polarization, etc.) by one or more optical elements (not shown) of the illumination subsystem. Light in each of the different optical paths may then be directed to the specimen. Multiple illumination channels may be configured to direct light to the specimen at the same time or at different times (e.g., when different illumination channels are used to sequentially illuminate the specimen). In another instance, the same illumination channel may be configured to direct light to the specimen with different characteristics at different times. For example, in some instances, optical element 18 may be configured as a spectral filter and the properties of the spectral filter can be changed in a variety of different ways (e.g., by swapping out the spectral filter) such that different wavelengths of light can be directed to the specimen at different times. The illumination subsystem may have any other suitable configuration known in the art for directing light having different or the same characteristics to the specimen at different or the same angles of incidence sequentially or simultaneously.

In one embodiment, light source 16 may include a broadband plasma (BBP) light source. In this manner, the light generated by the light source and directed to the specimen may include broadband light. However, the light source may include any other suitable light source such as a laser. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source may also include a polychromatic light source that generates light at multiple discrete wavelengths or wavebands.

Light from optical element 18 may be focused to beam splitter 21 by lens 20. Although lens 20 is shown in FIG. 1 as a single refractive optical element, it is to be understood that, in practice, lens 20 may include a number of refractive and/or reflective optical elements that in combination focus the light from the optical element to the specimen. The illumination subsystem shown in FIG. 1 and described herein may include any other suitable optical elements (not shown). Examples of such optical elements include, but are not limited to, polarizing component(s), spectral filter(s), spatial filter(s), reflective optical element(s), apodizer(s), beam splitter(s), aperture(s), and the like, which may include any such suitable optical elements known in the art. In addition, the system may be configured to alter one or more of the elements of the illumination subsystem based on the type of illumination to be used for inspection.

The inspection subsystem may also include a scanning subsystem configured to cause the light to be scanned over the specimen. For example, the inspection subsystem may include stage 22 on which specimen 14 is disposed during inspection. The scanning subsystem may include any suitable mechanical and/or robotic assembly (that includes stage 22) that can be configured to move the specimen such that the light can be scanned over the specimen. In addition, or alternatively, the inspection subsystem may be configured such that one or more optical elements of the inspection subsystem perform some scanning of the light over the specimen. The light may be scanned over the specimen in any suitable fashion.

The inspection subsystem further includes one or more detection channels. At least one of the one or more detection channels includes a detector configured to detect light from the specimen due to illumination of the specimen by the inspection subsystem and to generate output responsive to the detected light. For example, the inspection subsystem shown in FIG. 1 includes two detection channels, one formed by collector 24, element 26, and detector 28 and another formed by collector 30, element 32, and detector 34. As shown in FIG. 1, the two detection channels are configured to collect and detect light at different angles of collection. In some instances, one detection channel is configured to detect specularly reflected light, and the other detection channel is configured to detect light that is not specularly reflected (e.g., scattered, diffracted, etc.) from the specimen. However, two or more of the detection channels may be configured to detect the same type of light from the specimen (e.g., specularly reflected light). Although FIG. 1 shows an embodiment of the inspection subsystem that includes two detection channels, the inspection subsystem may include a different number of detection channels (e.g., only one detection channel or two or more detection channels). Although each of the collectors are shown in FIG. 1 as single refractive optical elements, it is to be understood that each of the collectors may include one or more refractive optical element(s) and/or one or more reflective optical element(s).

The one or more detection channels may include any suitable detectors known in the art. For example, the detectors may include photo-multiplier tubes (PMTs), charge coupled devices (CCDs), and time delay integration (TDI) cameras. The detectors may also include any other suitable detectors known in the art. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the inspection subsystem may be signals or data, but not image signals or image data. In such instances, a computer subsystem such as computer subsystem 36 of the system may be configured to generate images of the specimen from the non-imaging output of the detectors. However, in other instances, the detectors may be configured as imaging detectors that are configured to generate imaging signals or image data. Therefore, the system may be configured to generate the output described herein in a number of ways.

It is noted that FIG. 1 is provided herein to generally illustrate a configuration of an inspection subsystem that may be included in the system embodiments described herein. Obviously, the inspection subsystem configuration described herein may be altered to optimize the performance of the system as is normally performed when designing a commercial inspection system. In addition, the systems described herein may be implemented using an existing inspection system (e.g., by adding functionality described herein to an existing inspection system) such as the 28xx and 29xx series of tools that are commercially available from KLA-Tencor. For some such systems, the methods described herein may be provided as optional functionality of the system (e.g., in addition to other functionality of the system). Alternatively, the system described herein may be designed "from scratch" to provide a completely new system.

Computer subsystem 36 of the system may be coupled to the detectors of the inspection subsystem in any suitable manner (e.g., via one or more transmission media, which may include "wired" and/or "wireless" transmission media) such that the computer subsystem can receive the output generated by the detectors during scanning of the specimen. Computer subsystem 36 may be configured to perform a number of functions using the output of the detectors as described herein and any other functions described further herein. This computer subsystem may be further configured as described herein.

This computer subsystem (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem, then the different computer subsystems may be coupled to each other such that images, data, information, instructions, etc. can be sent between the computer subsystems as described further herein. For example, computer subsystem 36 may be coupled to computer subsystem(s) 102 (as shown by the dashed line in FIG. 1) by any suitable transmission media, which may include any suitable wired and/or wireless transmission media known in the art. Two or more of such computer subsystems may also be effectively coupled by a shared computer-readable storage medium (not shown).

Although the inspection subsystem is described above as being an optical or light-based inspection subsystem, the inspection subsystem may be an electron beam-based inspection subsystem. For example, in one embodiment, the energy directed to the specimen includes electrons, and the energy detected from the specimen includes electrons. In this manner, the energy source may be an electron beam source. In one such embodiment shown in FIG. 2, the inspection subsystem includes electron column 122, which is coupled to computer subsystem 124.

Figure 2:
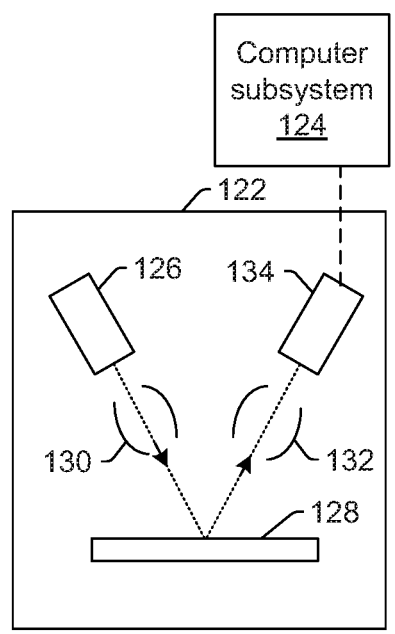

As also shown in FIG. 2, the electron column includes electron beam source 126 configured to generate electrons that are focused to specimen 128 by one or more elements 130. The electron beam source may include, for example, a cathode source or emitter tip, and one or more elements 130 may include, for example, a gun lens, an anode, a beam limiting aperture, a gate valve, a beam current selection aperture, an objective lens, and a scanning subsystem, all of which may include any such suitable elements known in the art.

Electrons returned from the specimen (e.g., secondary electrons) may be focused by one or more elements 132 to detector 134. One or more elements 132 may include, for example, a scanning subsystem, which may be the same scanning subsystem included in element(s) 130.

The electron column may include any other suitable elements known in the art. In addition, the electron column may be further configured as described in U.S. Pat. No. 8,664,594 issued Apr. 4, 2014 to Jiang et al., U.S. Pat. No. 8,692,204 issued Apr. 8, 2014 to Kojima et al., U.S. Pat. No. 8,698,093 issued Apr. 15, 2014 to Gubbens et al., and U.S. Pat. No. 8,716,662 issued May 6, 2014 to MacDonald et al., which are incorporated by reference as if fully set forth herein.

Although the electron column is shown in FIG. 2 as being configured such that the electrons are directed to the specimen at an oblique angle of incidence and are scattered from the specimen at another oblique angle, it is to be understood that the electron beam may be directed to and scattered from the specimen at any suitable angles. In addition, the electron beam-based subsystem may be configured to use multiple modes to generate images of the specimen (e.g., with different illumination angles, collection angles, etc.). The multiple modes of the electron beam-based subsystem may be different in any image generation parameters of the subsystem.

Computer subsystem 124 may be coupled to detector 134 as described above. The detector may detect electrons returned from the surface of the specimen thereby forming electron beam images of the specimen. The electron beam images may include any suitable electron beam images. Computer subsystem 124 may be configured to perform any of the functions described herein using the output of the detector and/or the electron beam images. Computer subsystem 124 may be configured to perform any additional step(s) described herein. A system that includes the inspection subsystem shown in FIG. 2 may be further configured as described herein.

It is noted that FIG. 2 is provided herein to generally illustrate a configuration of an electron beam-based inspection subsystem that may be included in the embodiments described herein. As with the optical inspection subsystem described above, the electron beam-based inspection subsystem configuration described herein may be altered to optimize the performance of the inspection subsystem as is normally performed when designing a commercial inspection system. In addition, the systems described herein may be implemented using an existing inspection system (e.g., by adding functionality described herein to an existing inspection system) such as the eSxxx series of tools that are commercially available from KLA-Tencor. For some such systems, the methods described herein may be provided as optional functionality of the system (e.g., in addition to other functionality of the system). Alternatively, the system described herein may be designed "from scratch" to provide a completely new system.

Although the inspection subsystem is described above as being a light-based or electron beam-based inspection subsystem, the inspection subsystem may be an ion beam-based inspection subsystem. Such an inspection subsystem may be configured as shown in FIG. 2 except that the electron beam source may be replaced with any suitable ion beam source known in the art. In addition, the inspection subsystem may be any other suitable ion beam-based subsystem such as those included in commercially available focused ion beam (FIB) systems, helium ion microscopy (HIM) systems, and secondary ion mass spectroscopy (SIMS) systems.

The one or more computer subsystems described above are configured for selecting one or more alignment targets from a design for the specimen. The design may include any of the design data or information described further herein. Selecting the one or more alignment targets may be performed using design data for the specimen, and the design data may include any of the different types of design data described herein. In this manner, in some embodiments, selecting the one or more alignment targets is performed without using a physical version of the specimen. For example, the embodiments described herein do not necessarily select the alignment target(s) by scanning a specimen on which the design has been printed or formed and then selecting the alignment target(s) based on the results of the scanning. In this manner, the alignment target(s) described herein may be acquired from the design for the specimen and will be aligned to corresponding specimen images as described further herein instead of starting from a specimen image to acquire a target image and grabbing corresponding design clips or portions of the design for alignment. In this manner, once an alignment target has been selected using the design, the computer subsystem(s) may acquire a design for each target. These steps may be performed during set up of an inspection process to be performed on the specimen with the inspection subsystem.

Such embodiments have, therefore, a number of advantages over other methods for selecting alignment targets. For example, selecting the alignment targets using the design for the specimen can be performed offline. Therefore, offline design target grabbing can free up tool time for vital production inspection runs. In contrast, selecting the alignment targets by performing image grabbing on tool can add setup time (e.g., 10 to 15 minutes) to the inspection process setup.

At least a portion of the one or more alignment targets includes built in targets included in the design for a purpose other than alignment of inspection results to design data space. The one or more alignment targets in at least the portion of the targets are, therefore, also referred to herein as built in target(s). The built in target(s) provide a new way of alignment of design to specimen coordinate systems. The embodiments described herein can advantageously provide higher reliability and accuracy of PDA results due to consistency of target selection. Aligning the inspection results to the design data space may therefore include determining design data space coordinates for the inspection results. The inspection results for which the design data space positions are determined may include any of the inspection results described herein including the raw output (data or images) generated by a detector of the inspection subsystem or a computer subsystem described herein and/or such raw output after it has been processed in some manner and may include output that corresponds to defects and/or output that does not correspond to defects detected on the specimen. The inspection results may be aligned to the design data space using the built in target(s) at any suitable time including before and after defect detection has been performed for the specimen. The purpose of the built in target(s) may include one of those described further herein or any other purpose known in the art other than for alignment of inspection results to design.

At least the portion of the one or more alignment targets does not include one or more individual device features. For example, alignment of inspection to design has recently gravitated to the use of device features for alignment due to their typically unique geometries, which make them particularly suitable for relatively accurate identification in inspection system output and design and for relatively accurate alignment. However, in some instances, device features suitable for alignment to design purposes may not be available in a given area. For example, in some instances, the repetitive nature of device features in an area of a specimen or design may mean that within a relatively small area on the specimen or in the design, suitable alignment features are not available due to lack of uniqueness. While alignment targets that are relatively far from the output for which they are being used to align to design may be sufficient and/or suitable for some alignment purposes and/or for some well controlled situations, often it is desirable to perform local alignment with alignment target(s) that are as close as possible to the inspection results that they are being used for aligning to design thereby increasing the accuracy of the alignment process. For example, recently it has become particularly advantageous to be able to align inspection results to design with sub-pixel accuracy (e.g., on the order of just a few nanometers) such that the location of inspection results with respect to the design can be determined with substantially high accuracy for purposes such as determining an appropriate detection sensitivity to be used for detecting defects in the inspection system output and determining the design data space locations of the detected defects. Therefore, performing alignment to design on a highly local scale has become particularly advantageous. As such, the built in targets described herein may be advantageously used for alignment of inspection results to design when suitable device features are not available for alignment purposes and/or are not available for alignment on the local scale desired.

In one embodiment, at least the portion of the one or more alignment targets includes a corner of a metrology cell. In another embodiment, at least the portion of the one or more alignment targets includes a center of a metrology cell. For example, oftentimes, there are built in patterns within dies that serve as targets for measurement of overlay, film, etc. The embodiments described herein are configured to use built in targets such as these within dies for specimen inspection. In particular, the center or corner of a metrology cell structure can be used for substantially accurate alignment.

Figure 3:
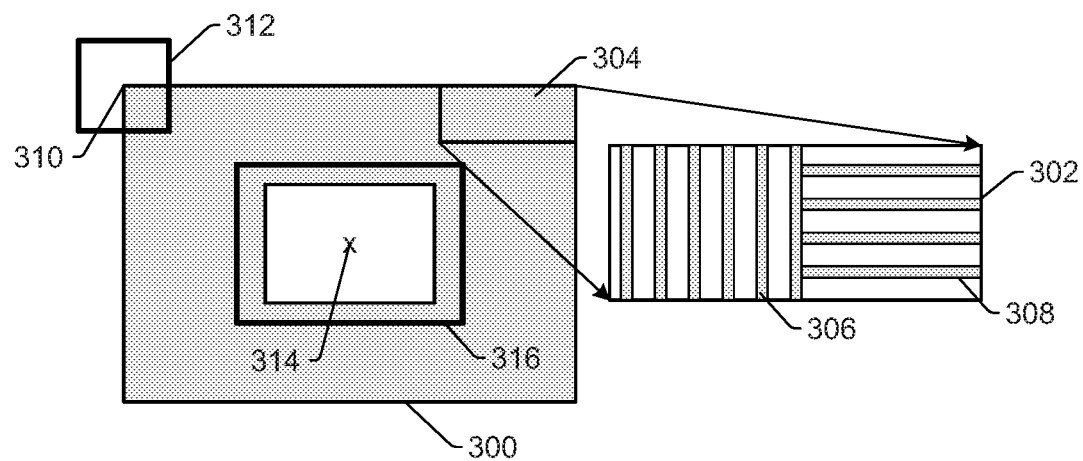
FIGS. 3 and 4 are schematic diagrams illustrating plan views of embodiments of alignment targets.

In one such example, as shown in FIG. 3, metrology cell 300 may include a number of different patterned features that are designed to be suitable for performing various measurements. In particular, as shown in enlarged view 302 of one portion 304 of the metrology cell, the metrology cell may include metrology structures such as vertical lines (or spaces) 306 and horizontal lines (or spaces) 308. The vertical and horizontal features may be used for performing one or more different measurements. The same features (or the same features in combination with other different features) may be included in the entire shaded portion of the metrology cell shown in FIG. 3. As further shown in FIG. 3, corner 310 of metrology cell 300 may be used as one alignment target 312, and center 314 of metrology cell 300 may be used as another alignment target 316 (although using only the corner or only the center of the metrology target for alignment is also possible). Searching for metrology cells for the purposes of alignment of inspection to design adds to ease of use of the embodiments described herein as the metrology cells are well known landmark locations.

Figure 4:
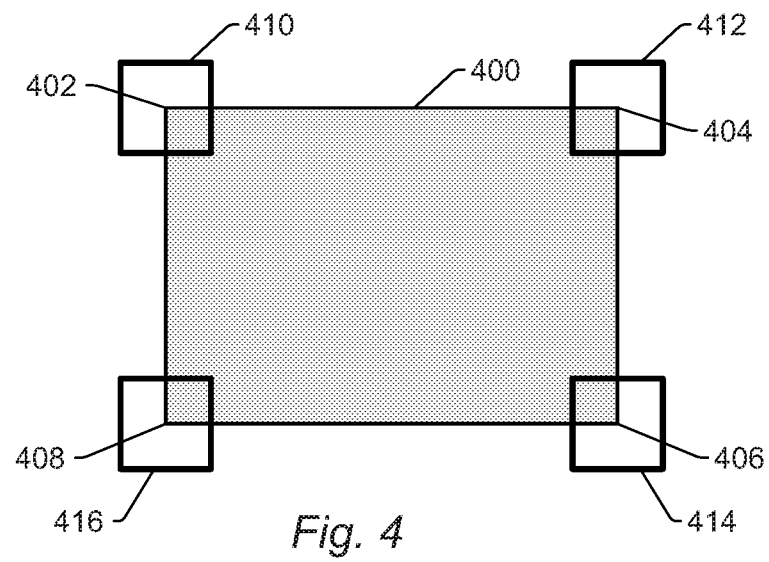

In a further embodiment, at least the portion of the one or more alignment targets includes a corner of a static random access memory (SRAM) structure. Searching for SRAM corner(s) for the purposes of alignment of inspection to design adds to the ease of use of the embodiments described herein as they are well known landmark locations. For example, as shown in FIG. 4, SRAM structure 400 may include four corners 402, 404, 406, and 408, and each of the corners of the structure may be used as a built in target (i.e., built in targets 410, 412, 414, and 416). Within the SRAM structure, only repeating device features (not shown in FIG. 4), each having the same characteristics, may be formed. As such, within the SRAM structure, there may not be any device feature(s) suitable for alignment of inspection to design. However, the embodiments described herein can be configured to use the SRAM corners as alignment target(s) for the purposes of alignment to design. Consequently, the alignment to design described herein can be performed on a local scale that is roughly equivalent to the SRAM structure period. In this manner, the corners of the SRAM structure can be used for substantially accurate alignment.

In an additional embodiment, at least the portion of the one or more alignment targets includes a corner of a structure. For example, in a manner similar to that described above for SRAM corners, the center or corner of other relatively easy to find structures (which may be formed of multiple, smaller structures) may be used for substantially accurate alignment by the embodiments described herein.

In another embodiment, at least the portion of the one or more alignment targets includes an alignment target designed for use by a lithography exposure tool. For example, oftentimes there are built in patterns within dies that serve as alignment targets for a scanner or other lithography exposure tool. The embodiments described herein are configured to use such built in targets within dies for specimen inspection. In addition, the embodiments described herein may be configured to use any built in targets configured for use by a scanner or other lithography exposure tool known in the art for the alignment described herein.

In some embodiments, at least the portion of the one or more alignment targets is not selected based on one or more modes of the inspection subsystem used to generate the output at the one or more positions of the one or more alignment targets on the specimen. For example, in contrast to the embodiments described herein, currently used PDA methods may be performed by finding alignment targets with a pattern that has horizontal and vertical features that are easy to align. In addition, the targets may be optical mode dependent. In this manner, different alignment targets may be selected for different optical modes such that, for each optical mode, targets are selected that can be imaged by the optical mode with sufficient resolution such that they can be aligned to a reference (e.g., design or an image simulated from the design). As such, sometimes, not enough targets can be found due to suppression of the pattern on the specimen by the optics mode or lack of pattern in the design. However, at least the portion of the alignment target(s) described herein may be substantially immune to the optical modes in that it/they may be resolved in the output of the inspection subsystem with sufficient resolution regardless of the optical mode used to generate the output to thereby allow alignment of the output to one of the references described herein (e.g., the design or a simulated image). In this manner, the alignment target(s) described herein may be optical mode independent (or not optical mode dependent). As such, the alignment target(s) described herein are advantageous in that even if the inspection process changes in the optical mode(s) used, the alignment target(s) can still be used for alignment to design. In addition, the alignment target(s) described herein are advantageous in that they should be able to be used for alignment to design even if the output generation performance of the inspection subsystem changes (e.g., due to drift in one or more optical or electron beam parameters of the inspection subsystem).

In a further embodiment, none of the alignment targets include any of the individual device features. For example, the alignment target(s) described herein may include only built in targets. In this manner, the alignment target(s) described herein may not include individual device features included in the design such as device features having horizontal and vertical features that are relatively easy to align and/or device features having some unique geometry within some space within the design. As such, the built in targets described herein may be used in place of any other types of alignment targets currently used in the art of wafer inspection.

Using built in targets such as those described herein may be advantageous in that the process variation cannot be well controlled for targets in logic regions. Although some of the built in targets described herein may sometimes be relatively hard to find, such built in targets are usually required to have sufficient accuracy (e.g., in SRAM) making them good target candidates for the PDA described herein. In addition, the built in target embodiments described herein can be used for higher alignment accuracy in some portions of a die compared to previously used alignment targets. For example, in currently used alignment methods, it has not been possible to accurately determine, for example, the exact position of N-type metal-oxide-semiconductor (NMOS) or P-type (PMOS) in SRAM. Only when using an SRAM corner as a built in target as described herein can the offset calculation be accurate enough to separate NMOS from PMOS locally. In addition, the built in targets that are selected as described herein can vary depending on the layer of the specimen that is being inspected in the inspection process. For example, the computer subsystem(s) may select different alignment target(s) when using different selection criteria. In addition, some built in targets like SRAM corners may be selected to make certain use cases possible. In this manner, the built in targets selected by the embodiments described herein may not necessarily be better quality targets due to their contrast or shape, for example, than those used previously but they may be located substantially close to regions within a die for which higher accuracy alignment is particularly advantageous.

In an additional embodiment, at least an additional portion of the one or more alignment targets includes a portion of the individual device features. For example, although at least the portion of the alignment target(s) described herein (i.e., the built in target(s)) does not include individual device features, such alignment targets can be used as a complement or alternative to other types of alignment targets that are available in the design. In this manner, one portion of the alignment target(s) used by the embodiments described herein may include the built in type of alignment targets described herein, while another portion of the alignment target(s) used by the embodiments described herein may include another type of alignment targets such as alignment targets selected to include horizontal and vertical device features that are relatively easy to align, alignment targets that are optical mode dependent, and the like.

In some instances in which the alignment targets used by the embodiments described herein include non-built in targets, the computer subsystem(s) may be configured for causing the inspection subsystem to scan an entire die on the specimen (or as much of the die as will be inspected during an inspection process using the inspection subsystem) thereby generating output for the specimen and finding targets in the output that are suitable for alignment of the inspection output to design. In such embodiments, the computer subsystem(s) may also be configured to acquire a portion of the design for each non-built in target. For example, once a portion of the design printed on the specimen has been selected as a non-built in target, the computer subsystem(s) may search the design for the specimen for a corresponding portion of the design and then acquire that portion of the design for the non-built in target. These steps may be performed during set up of an inspection process to be performed on the specimen. The computer subsystem(s) may be configured for selecting non-built in targets that are as evenly distributed across a die as possible. In addition, the computer subsystem(s) may be configured for selecting non-built in targets as described in U.S. Pat. No. 7,676,077 issued on Mar. 9, 2010 to Kulkarni et al., which is incorporated by reference as if fully set forth herein. The embodiments described herein may be further configured as described in this patent.

In this manner, the embodiments described herein may be configured to perform PDA using different types of alignment targets (e.g., built in target(s) and possibly non-built in target(s)). For example, it may not always be possible to know which alignment target(s) should be used for all regions in a die. Sometimes, it could be that there are not enough of a certain type of target in certain swaths of inspection subsystem output to make alignment possible. In addition, density of a particular type of alignment target can be too low to provide the desired PDA accuracy. Therefore, in some instances, it may be advantageous to use different types of alignment targets in the same alignment method.

The computer subsystem(s) are also configured for aligning one or more images for the one or more alignment targets to one or more portions of the design corresponding to the one or more alignment targets. Aligning the one or more images to the one or more portions of the design may be performed in a number of different manners. For example, the one or more images may be aligned to the one or more portions of the design by pattern matching or any other suitable aligning method and/or algorithm known in the art. The one or more images that are aligned to the one or more portions of the design may include different types of images described herein. In addition, the one or more portions of the design may include different types of information such as the design data itself or other types of design information described herein. This step may be performed during set up of an inspection process to be performed on the specimen with the inspection subsystem.

In one embodiment, the computer subsystem(s) are configured for generating one or more simulated images illustrating how the one or more portions of the design will appear in images generated by the inspection subsystem, and aligning the one or more images includes aligning the one or more images to the one or more simulated images. These steps may be performed during set up of an inspection process to be performed on the specimen with the inspection subsystem.

Figure 5:
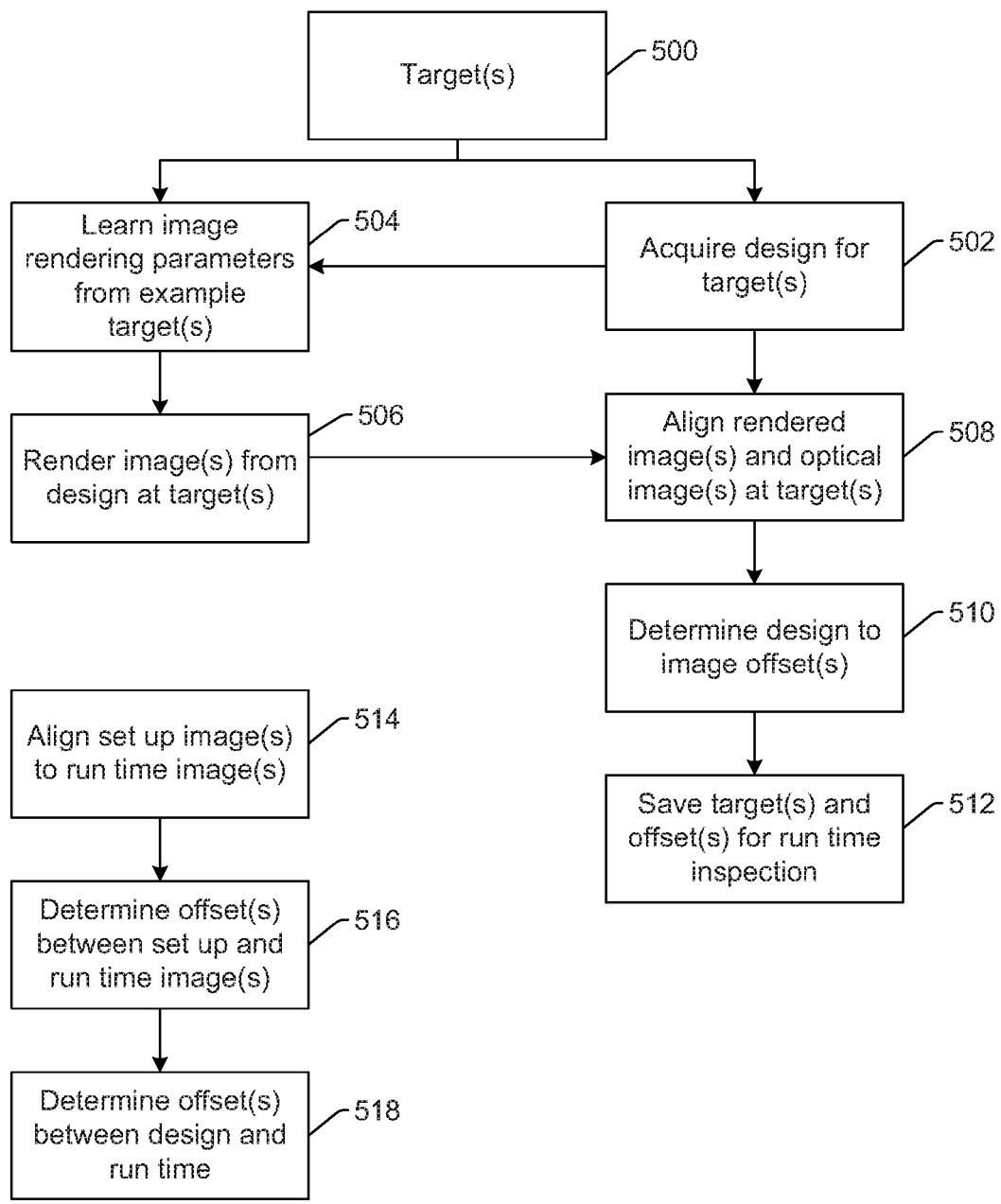
FIGS. 5-7 are flow diagrams illustrating embodiments of steps that may be performed by one or more computer subsystem embodiments described herein for determining a position of output generated by an inspection subsystem in design data space.

In some such embodiments, the computer subsystem(s) may be configured for learning image rendering parameters from example targets. For example, as shown in FIG. 5, target(s) 500 that have been selected as described further herein may be used for acquiring the design for the target(s) as shown in step 502. The target(s) and the design acquired for the target(s) may then be used for learning image rendering parameters for example target(s), as shown in step 504. Learning the image rendering parameters may be performed in any suitable manner (e.g., as in setting up and/or calibrating a simulation model or method). The example targets may include sampled sites that mostly are located in the logic region. In addition, the example targets may include a selection of representative samples from some portion of the die that covers various patterns, e.g., dense geometry, sparse geometry, etc. This step may be performed for built in and/or non-built in targets.

The computer subsystem(s) may then render images from the design at each target. This step may also be performed for built in and/or non-built in targets. The difficulty of alignment between optical image(s) and design may be minimized by rendering a simulated optical image from design that appears substantially similar to optical image(s) that would be generated by the inspection subsystem for a specimen on which the design has been printed or formed to thereby achieve reasonable alignment accuracy. To generate the most accurate simulated images, the simulation can involve the simulation of electromagnetic (EM) field by solving Maxwell's equations from three-dimensional information for the chip design and material, followed by simulation of the optical parameters of the inspection subsystem used to form an image of the specimen. Otherwise, over simplified rendering can produce a less satisfactory result with alignment to the real optical image.

In addition, the computer subsystem(s) may then align the rendered image and the optical image at each target. For example, as shown in step 506 of FIG. 5, the computer subsystem(s) may be configured to render image(s) from design at the target(s). This step may also be performed for built in and non-built in targets. As further shown in step 508 in FIG. 5, the computer subsystem(s) may be configured for aligning the rendered image(s) and optical image(s) at the target(s). Aligning the rendered image and the optical image may be otherwise performed as described herein. As described further herein, the target selection may be performed offline. Due to the offline nature of the target selection, a better rendering algorithm and/or method (e.g., more complex and time consuming to perform) can be used for simulating the images that would be generated by the inspection subsystem for the targets, which can provide simulated images that more closely match how the targets will be printed on the specimen and imaged by the inspection subsystem thereby reducing match result variability due to inaccurate design rendering.

The computer subsystem(s) are also configured for determining one or more offsets between the one or more images and the one or more portions of the design based on results of aligning the one or more images. In this manner, the computer subsystem(s) described herein may be configured to determine design-to-image offsets. For example, as shown in step 510 of FIG. 5, the computer subsystem(s) may be configured for determining design to image offset(s). The computer subsystem(s) may also be configured for saving information for the alignment target(s) and the determined offset(s) to a computer-readable storage medium such as a database or one of the other storage media described herein for run time inspection. For example, as shown in step 512 of FIG. 5, the computer subsystem(s) may be configured for saving target(s) and offset(s) for run time inspection. These steps may be performed during set up of an inspection process to be performed on the specimen with the inspection subsystem. In addition, these steps may be performed for built in and possibly non-built in targets. For example, each inspection frame can have several targets, which can include a combination of non-built in targets and built in targets. The different targets may be aligned to design in different ways described herein. However, within each frame, the offsets of all available targets to design may be used to determine the offset to design at a particular location. For example, the offset to design at any particular location can be interpolated from the offset at each target. However, all or fewer than all of the alignment targets in any given frame of inspection subsystem output can be used for purposes of alignment as described herein depending on the accuracy and speed desired for any given use case.

The design-to-image offsets may be determined in any suitable manner based on the one or more portions of the design that match the one or more images and their corresponding design data space coordinates and inspection space (e.g., inspection subsystem or specimen) coordinates, respectively. The design-to-image offsets may have any suitable format (e.g., a function or formula). In addition, information for the design-to-image offsets may be stored in any suitable storage media described herein. Furthermore, the design-to-image offsets may be determined in one only direction (e.g., the x or the y direction) or in two directions (e.g., the x and y directions). Moreover, the design-to-image offsets may be determined using design data space and inspection space coordinates having any suitable format (e.g., polar and Cartesian coordinates).

In one embodiment, determining the one or more offsets is performed for each inspection frame of the output generated by the inspection subsystem for the specimen. For example, the computer subsystem(s) may be configured to determine design-to-image offsets for each inspection frame from the target(s). An inspection "frame" may be generally defined as a relatively small portion of output generated by an inspection subsystem that can be collectively processed as a unit by the system. Therefore, a "frame" of output can vary depending on the inspection subsystem configuration as well as the configuration of any components included in the system for handling and/or processing the output generated by the inspection subsystem.

The computer subsystem(s) are further configured for aligning output generated by the inspection subsystem at one or more positions of the one or more alignment targets on the specimen to the one or more images for the one or more alignment targets. For example, the computer subsystem(s) may be configured for aligning an image acquired during set up to an image acquired at run time. In one such example, as shown in step 514 in FIG. 5, the computer subsystem(s) may be configured for aligning the set up image(s) to run time image(s). Such aligning may be performed for each of the alignment targets (i.e., the built in target(s) and possibly the non-built in target(s)). In addition, such aligning may be performed during run time of an inspection process performed on the specimen with the inspection subsystem. Such aligning may be further performed as described herein. The output generated by the inspection subsystem and used for this step may include any of the output described herein.

The computer subsystem(s) are also configured for determining one or more additional offsets between the output generated at the one or more positions of the one or more alignment targets on the specimen and the one or more images for the one or more alignment targets based on results of aligning the output. For example, as shown in step 516 of FIG. 5, the computer subsystem(s) may be configured for determining offset(s) between set up and run time image(s). In this manner, the computer subsystem(s) may be configured for determining offset(s) between an image acquired during set up and an image acquired at run time. In this manner, the additional offset(s) may be a relationship between two different images generated from inspection subsystem output. As such, the additional offset(s) may be configured for translating one set of inspection subsystem or specimen space coordinates to another set of inspection subsystem or specimen space coordinates. Determining the additional offset(s) may be performed during run time of an inspection process performed on the specimen with the inspection subsystem. This step may be performed for the built in target(s) and possibly the non-built in target(s). Determining the additional offset(s) may be performed as described further herein. In addition, the additional offset(s) may be further configured as described herein.

In one embodiment, determining the one or more additional offsets is performed for each inspection frame of the output generated by the inspection subsystem for the specimen. For example, the computer subsystem(s) may be configured for determining offset(s) between an image acquired during set up and an image acquired during run time for each inspection frame.

The computer subsystem(s) are further configured for determining design data space positions of output generated by the inspection subsystem at other positions on the specimen based on the one or more offsets, the one or more additional offsets, and specimen space positions of the output generated at the other positions on the specimen. Determining the design data space positions of the output may be performed during run time of an inspection process performed on the specimen with the inspection subsystem. This step may be performed for the built in target(s) and possibly the non-built in target(s). In this manner, design data space positions can be determined for inspection subsystem output other than that corresponding to the alignment target(s). In one such example, the specimen space positions of the output generated at non-alignment target positions may be input to the additional offset(s) to thereby determine coordinates of the output with respect to the set up image (the image of the alignment target acquired by the inspection subsystem). In this manner, the inspection subsystem or specimen space coordinates may be translated to other inspection subsystem or specimen space coordinates with the additional offset(s). Those translated inspection subsystem or specimen space coordinates may then be input to the one or more offsets to translate the new inspection subsystem or specimen space coordinates to design data space coordinates.

Of course, such step(s) may be consolidated or performed somewhat differently. For example, the one or more offsets and the one or more additional offsets may be translated into a single set of offset(s) that can be used to translate inspection subsystem or specimen space coordinates at locations other than the alignment targets directly to design data space coordinates. In one such example, in some embodiments, determining the design data space positions includes determining one or more further offsets between the output generated by the inspection subsystem at the other positions and the design based on the one or more offsets and the one or more additional offsets and determining the design data space positions based on the one or more further offsets and the specimen space positions of the output generated at the other positions on the specimen. For example, the computer subsystem(s) may be configured for determining offsets between design and run time images, as shown in step 518 of FIG. 5. Determining the one or more further offsets may be performed during set up or run time of an inspection process performed on the specimen with the inspection subsystem. This step may be performed for the built in target(s) and possibly the non-built in target(s). The one or more further offsets may otherwise be configured as described herein.

In one such embodiment, determining the one or more further offsets is performed for each inspection frame of the output generated by the inspection subsystem for the specimen. For example, the computer subsystem(s) may be configured for determining offset(s) between design and run time images for each inspection frame.

In another embodiment, at least the portion of the one or more alignment targets includes two or more alignment targets having the same characteristics. For example, two or more (or all) of the built in targets may be the same. Two or more of the alignment targets may, therefore, have the same shape, size, proportions, orientations, and any other characteristics that can be used to describe the alignment targets.

Figure 6:
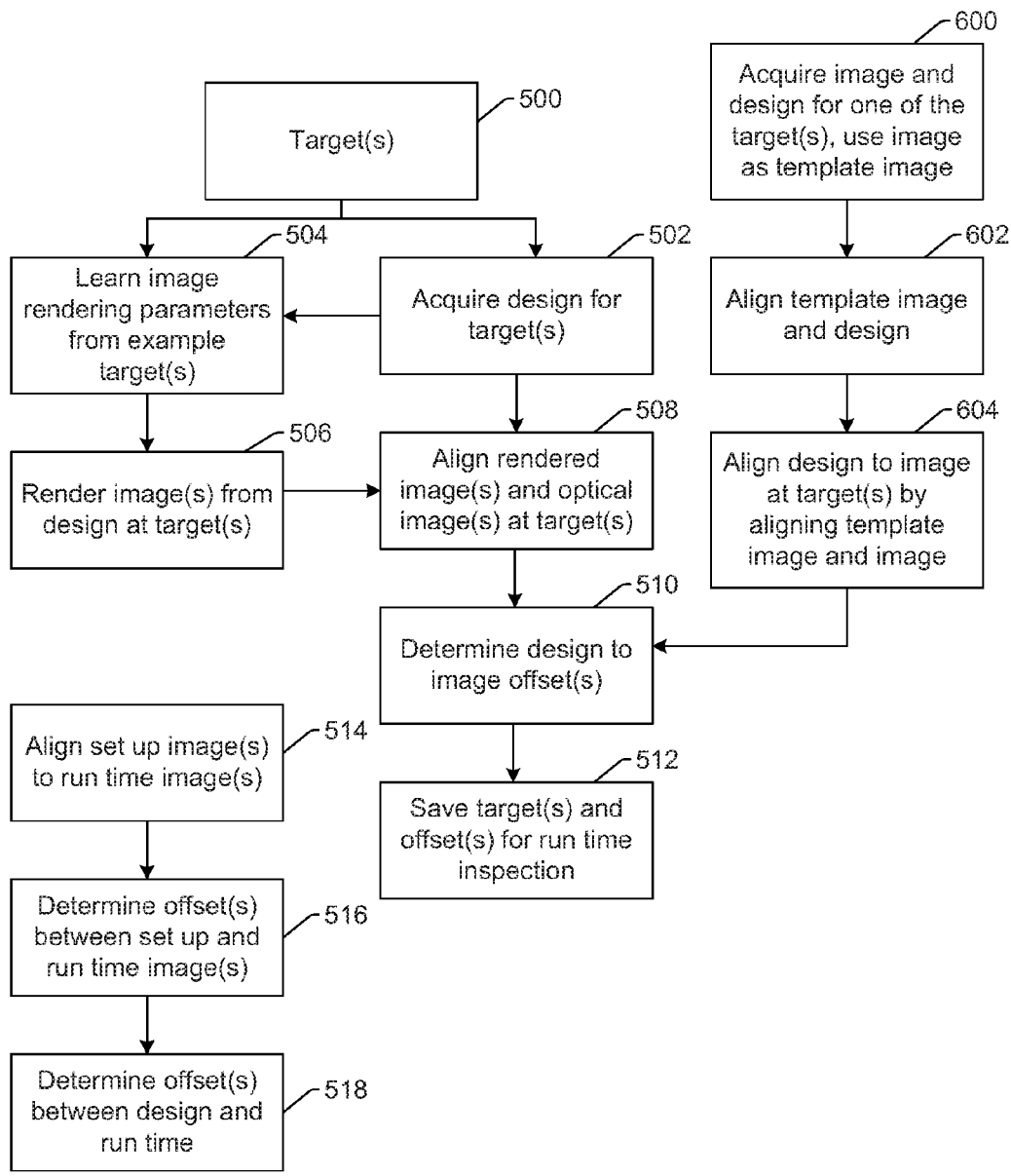

In one such embodiment, aligning the one or more images includes generating an image for one of the two or more alignment targets by imaging the one alignment target on the specimen with the inspection subsystem, aligning the image for the one alignment target with a portion of the design for the one alignment target, and aligning the image for the one alignment target with images generated by the inspection subsystem for others of the two or more alignment targets thereby aligning the images for the others of the two or more alignment targets to the portion of the design. For example, the computer subsystem(s) may be configured for acquiring an image and design at one of the built in targets that are the same. That image may then be used as a template image. In one such example, as shown in step 600 of FIG. 6, the computer subsystem(s) may be configured for acquiring an image and design for one of the target(s) and using the image as a template image. For example, the coordinates of the built in target(s) may be determined based on the design space coordinates of the built in target(s) and the layout of the design on the specimen. In this manner, the design space coordinates of the built in target(s) can be converted into specimen space or inspection subsystem coordinates and images can be acquired using the inspection subsystem.

The computer subsystem(s) may also be configured for aligning the template image to the design, as shown in step 602 of FIG. 5. Alignment between design for the built in target(s) and optical image for each target(s) can be achieved, in this embodiment, manually offline. For example, the computer subsystem may be configured to display the image acquired by the inspection subsystem for the location of one of the alignment targets and the portion of the design for the alignment targets to a user. The computer subsystem(s) may also provide the user with some method for aligning the optical or electron beam image to the portion of the design. In addition, the computer subsystem(s) may be configured to receive the manual alignment results from the user. The results of the manual alignment may then be used as described further herein. The optical or electron beam image (i.e., the template image) aligned with design offline can be used as a proxy for design in real time to align with optical or electron beam image(s) for other target(s) that are the same as the one for which manual offline alignment was performed. This approach avoids the difficulty of rendering a simulated optical image from design and is capable of substantially high alignment accuracy.

In addition, the computer subsystem(s) may be configured for aligning the design to the image at each built in target by aligning the template image and an image acquired by the inspection subsystem. For example, as shown in step 604 of FIG. 6, the computer subsystem(s) may be configured for aligning design to image at target(s) by aligning template image (the design proxy) and image. Once the design has been aligned to the image acquired by the inspection subsystem at each built in target by aligning the template image to the image acquired by the inspection subsystem, the computer subsystem(s) may be configured to determine the design to image offset(s) as described further herein. These steps may be performed during set up of the inspection process to be performed for the specimen.

In some embodiments, at least the portion of the one or more alignment targets includes two or more alignment targets having the same characteristics except for within die position. For example, in some instances, all of the built in targets may be the same (as described further herein by having all of the same characteristics) and may be distributed across a die.

Figure 7:
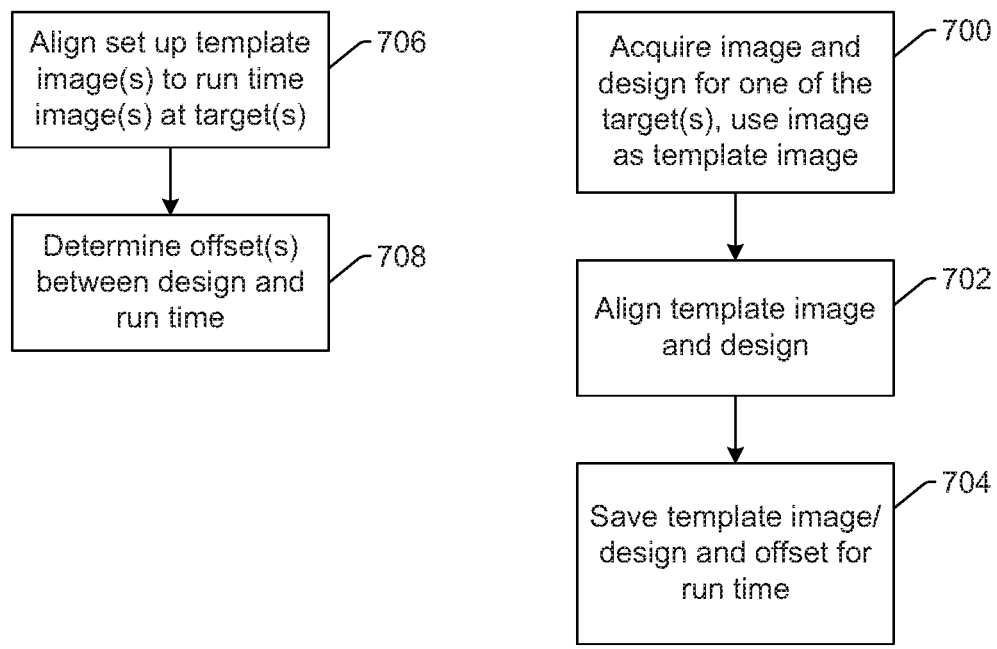

In one such embodiment, aligning the one or more images includes generating an image for one of the two or more alignment targets by imaging the one alignment target on the specimen with the inspection subsystem and aligning the image for the one alignment target with a portion of the design for the one alignment target. For example, the computer subsystem(s) may be configured for acquiring an image and a portion of a design at one built in target and the acquired image may be used as a template image. In one such example, as shown in step 700 of FIG. 7, the computer subsystem(s) may be configured for acquiring an image and design for one of the target(s) and using the image as the template image, and these steps may be performed as described further herein. The computer subsystem(s) may then align the template image and the design, as shown in step 702 of FIG. 7, which may be performed as described further herein. In addition, the computer subsystem(s) may be configured to save the template image and design and the template to design offset, which may be determined as described further herein, for use during run time. These steps may be performed as described further herein. For example, as shown in step 704 of FIG. 7, the computer subsystem(s) may be configured for saving the template image, design, and offset for run time. These steps may be performed during set up of an inspection process for the specimen.

In some such embodiments, aligning the output includes aligning the output generated by the inspection subsystem at the one or more positions of the one or more alignment targets on the specimen to the image for the one alignment target. For example, the computer subsystem(s) may be configured for aligning the set up template image to the run time image at each built in target, which may be performed as described further herein. In one such example, as shown in step 706 of FIG. 7, the computer subsystem(s) may be configured for aligning the set up template image(s) to run time image(s) at the target(s). The results of aligning the set up template image to the run time image may be used to determine the offset(s) between design and run time as described further herein. For example, as shown in step 708 of FIG. 7, the computer subsystem(s) may be configured for determining offset(s) between design and run time. These steps may be performed during run time of the inspection process for the specimen. In addition, the embodiment of the steps shown in FIG. 7 may not include other step(s) shown in other embodiments described herein if the built in targets are sufficient for alignment and no other alignment target locations will be used for PDA. If only the built in targets are used, the alignment approach may be much simpler as shown in this figure.

In some embodiments, the computer subsystem(s) are configured for detecting defects on the specimen based on the output generated at the other positions and determining one or more parameters used for detecting the defects based on the design data space positions of the output generated at the other positions. Detecting the defects on the specimen may be performed in any suitable manner known in the art (e.g., applying a threshold to the output and determining that any output having a value above the threshold corresponds to a defect or a potential defect) with any suitable defect detection method and/or algorithm. The one or more defect detection parameters that are determined may include any adjustable parameters used for defect detection, and particularly those that relate to the sensitivity of the defect detection (e.g., a threshold). In one example, the design data space positions of the output may be determined as described herein. The design data space positions may be used to determine one or more characteristics of the design for the specimen at the design data space positions of the output. For example, the design data space positions may be used to determine the type of features that are formed at the locations on the specimen at which the output was generated. Information about those types of features may then be used to determine the one or more defect detection parameters on a position-to-position basis. In this manner, since the design data space positions of the output can be determined as described herein with substantially high accuracy, the parameter(s) used for detecting defects can be adjusted on a position-to-position basis with substantially high accuracy thereby providing defect detection sensitivity that can be altered based on the changes in the characteristics of the design at different positions on the specimen. In this manner, the sensitivity of the defect detection can be adjusted depending on whether the different positions on the specimen are located at potential DOI locations in the design.

In another embodiment, the computer subsystem(s) are configured for detecting defects on the specimen based on the output generated at the other positions and determining design data space positions of the defects based on the design data space positions of the output generated at the other positions. Detecting defects on the specimen may be performed as described further herein. Determining the design data space positions of the defects may include determining design data space positions of the output corresponding to the defects and assigning those design data space positions to the defects. Therefore, since the embodiments described herein can determine the design data space positions of the output with substantially high accuracy, the defect location accuracy will be substantially high. In this manner, the positions of the detected defects can be determined in design data space, which enables determining information about the portion of the design in which the defects are located much easier and more accurate. Therefore, the embodiments described herein can be used to determine information about the design for the design data space defect positions with substantially high accuracy. As such, the embodiments described herein can be used to provide inspection results that are more relevant to the design for the specimen than other currently used systems and methods.

Another embodiment relates to a computer-implemented method for determining a position of output generated by an inspection subsystem in design data space. The method includes steps for each of the functions of the computer subsystem(s) described above. The inspection subsystem is configured as described herein.

Each of the steps of the method may be performed as described further herein. The method may also include any other step(s) that can be performed by the inspection subsystem and/or computer subsystem(s) or system(s) described herein. The steps of the method are performed by one or more computer systems, which may be configured according to any of the embodiments described herein. In addition, the method described above may be performed by any of the system embodiments described herein.

Figure 8:
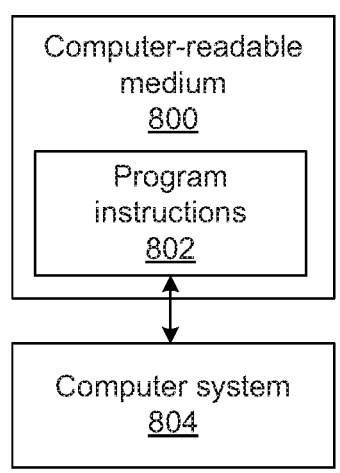
FIG. 8 is a block diagram illustrating one embodiment of a non-transitory computer-readable medium storing program instructions executable on a computer system for performing one or more of the computer-implemented methods described herein.

An additional embodiment relates to a non-transitory computer-readable medium storing program instructions executable on a computer system for performing a computer-implemented method for determining a position of output generated by an inspection subsystem in design data space. One such embodiment is shown in FIG. 8. In particular, as shown in FIG. 8, non-transitory computer-readable medium 800 includes program instructions 802 executable on computer system 804. The computer-implemented method may include any step(s) of any method(s) described herein.

Program instructions 802 implementing methods such as those described herein may be stored on computer-readable medium 800. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Computer system 804 may be configured according to any of the embodiments described herein.

All of the methods described herein may include storing results of one or more steps of the method embodiments in a computer-readable storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc.

Further modifications and alternative embodiments of various aspects of the invention will be apparent to those skilled in the art in view of this description. For example, methods and systems for determining a position of output generated by an inspection subsystem in design data space are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured to determine a position of output generated by an inspection subsystem in design data space, comprising:

an inspection subsystem comprising at least an energy source and a detector, wherein the energy source is configured to generate energy that is directed to a specimen, and wherein the detector is configured to detect energy from the specimen and to generate output responsive to the detected energy; and one or more computer subsystems configured for:

selecting one or more alignment targets from a design for the specimen, wherein at least a portion of the one or more alignment targets comprises built in targets included in the design for a purpose other than alignment of inspection results to design data space, wherein at least the portion of the one or more alignment targets does not comprise one or more individual device features, and wherein at least the portion of the one or more alignment targets further comprises a corner of a structure that is formed of multiple, smaller structures;

aligning one or more images for the one or more alignment targets o one or more portions of the design corresponding to the one or more alignment targets;

determining one or more offsets between the one or more images and the one or more portions of the design based on results of aligning the one or more images;

aligning output generated by the inspection subsystem at one or more positions of the one or more alignment targets on the specimen to the one or more images for the one or more alignment targets;

determining one or more additional offsets between the output generated at the one or more positions of the one or more alignment targets on the specimen and the one or more images for the one or more alignment targets based on results of aligning the output; and determining design data space positions of output generated by the inspection subsystem at other positions on the specimen based on the one or more offsets, the one or more additional offsets, and specimen space positions of the output generated at the other positions on the specimen.

2. The system of claim 1, wherein the corner of the structure comprises a corner of a metrology cell.

3. The system of claim 1, wherein at least the portion of the one or more alignment targets further comprises a center of a metrology cell.

4. The system of claim 1, wherein the corner of the structure comprises a corner of a static random access memory structure.

5. The system of claim 1, wherein at least the portion of the one or more alignment targets further comprises an alignment target designed for use by a lithography exposure tool.

6. The system of claim 1, wherein at least the portion of the one or more alignment targets is not selected based on one or more modes of the inspection subsystem used to generate the output at the one or more positions of the one or more alignment targets on the specimen.

7. The system of claim 1, wherein none of the alignment targets comprise any of the individual device features.

8. The system of claim 1, wherein at least an additional portion of the one or more alignment targets comprises a portion of the individual device features.

9. The system of claim 1, wherein said selecting is performed without using a physical version of the specimen.

10. The system of claim 1, wherein the one or more computer subsystems are further configured for generating one or more simulated images illustrating how the one or more portions of the design will appear in images generated by the inspection subsystem, and wherein said aligning the one or more images comprises aligning the one or more images to the one or more simulated images.

11. The system of claim 1, wherein determining the one or more offsets is performed for each inspection frame of the output generated by the inspection subsystem for the specimen.

12. The system of claim 1, wherein determining the one or more additional offsets is performed for each inspection frame of the output generated by the inspection subsystem for the specimen.

13. The system of claim 1, wherein determining the design data space positions comprises:

determining one or more further offsets between the output generated by the inspection subsystem at the other positions and the design based on the one or more offsets and the one or more additional offsets; and determining the design data space positions based on the one or more further offsets and the specimen space positions of the output generated at the other positions on the specimen.

14. The system of claim 13 wherein determining the one or more further offsets is performed for each inspection frame of the output generated by the inspection subsystem for the specimen.

15. The system of claim 1, wherein at least the portion of the one or more alignment targets further comprises two or more alignment targets having the same characteristics.

16. The system of claim 15, Wherein aligning the one or more images comprises:

generating an image for one of the two or more alignment targets by imaging the one alignment target on the specimen with the inspection subsystem;

aligning the image for the one alignment target with a portion of the design for the one alignment target; and aligning the image for the one alignment target with images generated by the inspection subsystem for others of the two or more alignment targets thereby aligning the images for the others of the two or more alignment targets to the portion of the design.

17. The system of claim 1, wherein at least the portion of the one or more alignment targets further comprises two or more alignment targets having the same characteristics except for within die position.

18. The system of claim 17, wherein aligning the one or more images comprises:

generating an image for one of the two or more alignment targets by imaging the one alignment target on the specimen with the inspection subsystem; and aligning the image for the one alignment target with a portion of the design for the one alignment target.

19. The system of claim 18, wherein aligning the output comprises aligning the output generated by the inspection subsystem at the one or more positions of the one or more alignment targets on the specimen to the image for the one alignment target.

20. The system of claim 1, wherein the one or more computer subsystems are further configured for detecting defects on the specimen based on the output generated at the other positions and determining one or more parameters used for said detecting based on the design data space positions of the output generated at the other positions.

21. The system of claim 1, wherein the one or more computer subsystems are further configured for detecting defects on the specimen based on the output generated at the other positions and determining design data space positions of the defects based on the design data space positions of the output generated at the other positions.

22. The system of claim 1, wherein the specimen comprises a wafer.

23. The system of claim 1, wherein the energy directed to the specimen comprises light, and wherein the energy detected from the specimen comprises light.

24. The system of claim 1, wherein the energy directed to the specimen comprises electrons, and wherein the energy detected from the specimen comprises electrons.

25. A non-transitory computer-readable medium, storing program instructions executable on a computer system for performing a computer-implemented method for determining a position of output generated by an inspection subsystem in design data space, wherein the computer-implemented method comprises:

selecting one or more alignment targets from a design for a specimen, wherein at least a portion of the one or more alignment targets comprises built in targets included in the design for a purpose other than alignment of inspection results to design data space, wherein at least the portion of the one or more alignment targets does not comprise one or more individual device features, and wherein at least the portion of the one or more alignment targets further comprises a corner of a structure that is formed of multiple, smaller structures;

aligning one or more images for the one or more alignment targets to one or more portions of the design corresponding to the one or more alignment targets;

determining one or more offsets between the one or more images and the one or more portions of the design based on results of aligning the one or more images;

aligning output generated by an inspection subsystem at one or more positions of the one or more alignment targets on the specimen to the one or more images for the one or more alignment targets, wherein the inspection subsystem comprises at least an energy source and a detector, wherein the energy source is configured to generate energy that is directed to a specimen, and wherein the detector is configured to detect energy from the specimen and to generate output responsive to the detected energy;

determining one or more additional offsets between the output generated at the one or more positions of the one or more alignment targets on the specimen and the one or more images for the one or more alignment targets based on results of aligning the output; and determining design data space positions of output generated by the inspection subsystem at other positions on the specimen based on the one or more offsets, the one or more additional offsets, and specimen space positions of the output generated at the other positions on the specimen.

26. A computer-implemented method for determining a position of output generated by an inspection subsystem in design data space, comprising:

selecting one or more alignment targets from a design for a specimen, wherein at least a portion of the one or more alignment targets comprises built in targets included in the design for a purpose other than alignment of inspection results to design data space, wherein at least the portion of the one or more alignment targets does not comprise one or more individual device features, and wherein at least the portion of the one or more alignment targets further comprises a corner of a structure that is formed of multiple, smaller structures;

aligning one or more images for the one or more alignment targets to one or more portions of the design corresponding to the one or more alignment targets;

determining one or more offsets between the one or more images and the one or more portions of the design based on results of aligning the one or more images;

aligning output generated by an inspection subsystem at one or more positions of the one or more alignment targets on the specimen to the one or more images for the one or more alignment targets, wherein the inspection subsystem comprises at least an energy source and a detector, wherein the energy source is configured to generate energy that is directed to a specimen, and wherein the detector is configured to detect energy from the specimen and to generate output responsive to the detected energy;

determining one or more additional offsets between the output generated at the one or more positions of the one or more alignment targets on the specimen and the one or more images for the one or more alignment targets based on results of aligning the output; and determining design data space positions of output generated by the inspection subsystem at other positions on the specimen based on the one or more offsets, the one or more additional offsets, and specimen space positions of the output generated at the other positions on the specimen, wherein steps of the method are performed by one or more computer systems.

* * * * *

UNITED STATES PATENT AND TRADEMARK OFFICE
CERTIFICATE OF CORRECTION

Page 1 of 1

PATENT NO. : 9,830,421 B2
APPLICATION NO. : 14/983452
DATED : November 28, 2017
INVENTOR(S) : Santosh Bhattacharyya et al.

It is certified that error appears in the above-identified patent and that said Letters Patent is hereby corrected as shown below:

On the Title Page

In the Inventors, Line 2, please delete "Braeuer" and substitute --Brauer--.

Signed and Sealed this
Eleventh Day of June, 2019

Andrei Iancu
*Director of the United States Patent and Trademark Office*